US012095220B2

(12) United States Patent
Takahashi

(10) Patent No.: US 12,095,220 B2
(45) Date of Patent: Sep. 17, 2024

(54) OPTICAL MODULE UNIT AND LASER DEVICE

(71) Applicant: Fujikura Ltd., Tokyo (JP)

(72) Inventor: Yukihiko Takahashi, Chiba (JP)

(73) Assignee: Fujikura Ltd., Tokyo (JP)

( * ) Notice: Subject to any disclaimer, the term of this patent is extended or adjusted under 35 U.S.C. 154(b) by 811 days.

(21) Appl. No.: 17/251,684

(22) PCT Filed: Jun. 12, 2019

(86) PCT No.: PCT/JP2019/023290
§ 371 (c)(1),
(2) Date: Dec. 11, 2020

(87) PCT Pub. No.: WO2019/240172
PCT Pub. Date: Dec. 19, 2019

(65) Prior Publication Data
US 2021/0257805 A1    Aug. 19, 2021

(30) Foreign Application Priority Data

Jun. 14, 2018    (JP) ................................. 2018-113309

(51) Int. Cl.
*H01S 5/024*    (2006.01)
*H01S 3/067*    (2006.01)
(Continued)

(52) U.S. Cl.
CPC ...... *H01S 3/09415* (2013.01); *H01S 3/06733* (2013.01); *H01S 3/0675* (2013.01);
(Continued)

(58) Field of Classification Search
CPC ............ H01S 5/02407; H01S 5/02423; H01S 5/4025; H01S 5/4012; H01S 5/405;
(Continued)

(56) References Cited

U.S. PATENT DOCUMENTS 5,105,429 A    4/1992  Mundinger et al.
5,900,967 A    5/1999  Zamel
(Continued)

FOREIGN PATENT DOCUMENTS

CN    101071936 A    11/2007
CN    107851963 A    3/2018
(Continued)

OTHER PUBLICATIONS

International Search Report issued in corresponding International Application No. PCT/JP2019/023290, dated Aug. 13, 2019 (2 pages).

*Primary Examiner* — Tod T Van Roy
*Assistant Examiner* — Delma R Forde
(74) *Attorney, Agent, or Firm* — Osha Bergman Watanabe & Burton LLP

(57) ABSTRACT

An optical module unit includes: optical modules each including light emitting elements; and a mount on which the light emitting elements are disposed on one side of the mount, and includes a sub-passage; and a manifold to which the optical modules are fixed. The manifold includes a first main passage to which a first end of each of the sub-passages is connected in parallel.

10 Claims, 9 Drawing Sheets

(51) Int. Cl.
  *H01S 3/094* (2006.01)
  *H01S 3/0941* (2006.01)
  *H01S 5/0239* (2021.01)

(52) U.S. Cl.
  CPC .. *H01S 3/094003* (2013.01); *H01S 3/094053* (2013.01); *H01S 5/0239* (2021.01)

(58) Field of Classification Search
  CPC . H01S 5/40–4093; H01S 5/024–02492; H01L 33/64–648
  See application file for complete search history.

(56) References Cited

U.S. PATENT DOCUMENTS

| | | |
|---|---|---|
| 6,240,116 B1 | 5/2001 | Lang et al. |
| 9,413,136 B1 | 8/2016 | Vethake et al. |
| 10,170,892 B2 * | 1/2019 | Yanase ............... G02B 27/0905 |
| 2009/0039502 A1 * | 2/2009 | Inui ...................... H01L 23/473 |
| | | 257/E23.098 |
| 2012/0230352 A1 | 9/2012 | Minelly et al. |
| 2017/0358900 A1 | 12/2017 | Kanskar et al. |
| 2018/0041012 A1 | 2/2018 | Tayebati et al. |

FOREIGN PATENT DOCUMENTS

| | | |
|---|---|---|
| JP | 2006054345 A | 2/2006 |
| JP | 2009065128 A | 3/2009 |
| JP | 2012089584 A | 5/2012 |
| JP | 2016054279 A | 4/2016 |
| JP | 2022028425  * | 2/2022 |
| WO | 94/08368 A1 | 4/1994 |
| WO | 2018/051430 A1 | 3/2018 |

\* cited by examiner

OPTICAL MODULE UNIT AND LASER DEVICE

TECHNICAL FIELD

The present invention relates to an optical module unit and a laser device.

BACKGROUND

There is known one of optical modules that emit light from laser diodes through an optical fiber. In this optical module, optical components such as the laser diodes, mirrors, a lens, and one end of the optical fiber are arranged in a housing, and the optical fiber is led out from inside to outside the housing. The light emitted from each of the laser diodes is condensed on the mirrors and the lens, then enters into the optical fiber, and is emitted from the other end of the optical fiber to the outside of the housing.

In the optical module as described above, the laser diode generates heat when emitting light, so that the optical module has a cooling structure. For example, Patent Literature 1 below describes a semiconductor laser device including a plurality of heat sinks having a fluid passage through which a cooling medium flows and a plurality of semiconductor laser modules. In this semiconductor laser device, heat sinks and semiconductor laser modules are alternately stacked, so that each of the semiconductor laser modules is disposed in contact with the heat sink. In this semiconductor laser device, a portion of heat generated by each of the semiconductor laser modules is conducted to the heat sink in contact with each of the semiconductor laser modules. Then, the portion of heat transferred to the heat sink is conducted to the cooling medium flowing through the fluid passage. In this way, the semiconductor laser module is cooled.

PATENT LITERATURE

[Patent Literature 1] JP 2012-89584 A

In the semiconductor laser device described in Patent Literature 1, the cooling medium is sequentially supplied to a plurality of heat sinks that are stacked. Therefore, among the plurality of heat sinks, to the heat sink to which the cooling medium is to be supplied secondarily and subsequently, the cooling medium in contact with the heat sink to which the cooling medium has been supplied before is supplied. On the other hand, the heat from the semiconductor laser module is transferred to the heat sink to raise the temperature. Thus, the cooling medium having a higher temperature is supplied to the heat sink with a lower priority in the supply of the cooling medium. As described above, in the semiconductor laser device described in Patent Literature 1, the temperatures of the cooling media supplied to the respective heat sinks tend to be different from each other. Therefore, in the optical module unit of Patent Literature 1 including a plurality of optical modules, the respective optical modules tend to have different cooling efficiencies.

SUMMARY

One or more embodiments of the present invention provide an optical module unit capable of suppressing variations in cooling efficiency of a plurality of optical modules, and a laser device including the optical module unit.

An optical module unit according to one or more embodiments of the present invention includes a plurality of optical modules having a plurality of light emitting elements, a mount in which the plurality of light emitting elements are arranged on one surface side, and a sub-passage formed in the mount, and a manifold to which the plurality of optical modules are fixed and which has a first main passage to which one end of the sub-passage included in each of the optical modules is connected in parallel.

Each of the optical modules has a sub-passage, and by making a cooling medium flow through the sub-passage, heat generated by the light emitting element is transferred to the cooling medium via the mount, so that the light emitting element can be cooled. That is, the mount functions as a heat sink, and the heat generated by the light emitting element which is a heat source is transferred to the cooling medium via the heat sink. The sub-passage included in each of the optical modules is connected in parallel to the first main passage of the manifold. Thus, the cooling medium that does not flow through the sub-passages of the other optical modules and is not heated by the other optical modules can be supplied to each of the optical modules through the first main passage. Thus, it can be suppressed that the temperature of the cooling medium supplied to each of the optical modules becomes non-uniform. Therefore, according to the optical module unit of the present invention, it is possible to suppress variations in cooling efficiency of the plurality of optical modules.

The optical module unit preferably further includes a second main passage to which the other end of each of the sub-passages is connected in parallel.

By connecting the other end of each of the sub-passages in parallel to the second main passage, the cooling medium flowing out from the plurality of sub-passages can be made to flow into the second main passage for batch processing. Thus, for example, the cooling medium once flowing through the sub-passage is allowed to flow into the second main passage to be recovered and then cooled, so that the cooling medium can be reused easily.

The second main passage is preferably formed in the manifold.

By forming both the first main passage and the second main passage in the manifold, the optical module unit can be downsized.

It is preferable that the mount have a plurality of element arrangement surfaces parallel to each other, the plurality of light emitting elements are arranged on the respective element arrangement surfaces, and the sub-passage be formed to be inclined with respect to the element arrangement surface so that an average of shortest distances between the respective light emitting elements and the sub-passage is smaller than that in a case where the sub-passage is formed in parallel to the element arrangement surface.

The average of the shortest distances between the respective light emitting elements and the sub-passage means a value obtained by summing the shortest distances between the respective light emitting elements and the sub-passage and dividing the sum by a total number of the light emitting elements. For example, when thirteen light emitting elements are provided, a value obtained by obtaining the shortest distances from the respective thirteen light emitting elements to the sub-passages and dividing a sum of these shortest distances by 13 which is the total number of the light emitting elements is the average of the shortest distances between the respective light emitting elements and the sub-passage. By the way, the plurality of element arrangement surfaces parallel to each other is formed in a stepped shape. When the light emitting element is disposed on such a stepped-shaped element arrangement surface, the sub-passage is formed to be inclined with respect to the element arrangement surface as described above, so that it can be suppressed that the respective distances between the light emitting element and the sub-passages become uneven. Thus, variations in cooling efficiency of each of the light emitting elements can be suppressed.

It is preferable that at least some of the plurality of light emitting elements be arranged at a position that does not overlap with a central axis of the sub-passage in a direction perpendicular to a surface where the light emitting element is installed.

The light emitting element and the central axis of the sub-passage do not overlap with each other in the direction perpendicular to the surface where the light emitting element is installed, so that as compared with a case where the light emitting element and the central axis of the sub-passage overlap with each other, a heat conduction path from the light emitting element in the mount to the sub-passage can be lengthened. Thus, the heat generated by the light emitting element is easily diffused in the mount functioning as a heat sink as described above, and the light emitting element can be cooled efficiently.

It is preferable that each of the optical modules have an optical fiber that guides the light, emitted from the plurality of light emitting elements, to the outside, and a surface that faces a surface where the optical fiber of each of the optical modules is disposed be fixed to the manifold.

The surface that faces the surface where the optical fiber is disposed is fixed to the manifold, so that as compared with a case where the other surfaces of the optical module are fixed to the manifold, relative displacement between an optical axis of light entering the optical fiber and an optical axis of the optical fiber can be suppressed. Thus, it is possible to suppress a decrease in efficiency of guiding the lights emitted from the plurality of light emitting elements to the outside.

The sub-passage included in each of the optical modules is preferably connected to the first main passage on a surface side where the optical module is fixed to the manifold.

By connecting the sub-passage of the optical module and the first main passage of the manifold on a surface side where the optical module and the manifold are fixed, the sub-passage and the first main passage can be connected in the shortest distance.

It is preferable that the optical modules adjacent to each other be spaced apart from each other.

Since the optical modules adjacent to each other are spaced apart from each other, even when the optical module is deformed by heat or the like, it is possible to suppress application of stress due to the deformation of the optical module to the optical modules adjacent to each other. Furthermore, since the optical modules adjacent to each other are spaced apart from each other, heat transfer between the optical modules adjacent to each other can be suppressed. Thus, when three or more optical modules are arranged in parallel, it can be suppressed that the temperature of the optical module disposed inside becomes higher than the temperature of the optical module disposed outside. That is, it can be suppressed that the temperature of each of the optical modules becomes non-uniform.

A laser device of one or embodiments of the present invention is characterized by including the optical module unit of one or more embodiments of the present invention described above and an optical fiber for propagating light emitted from the optical module unit.

It is preferable that a plurality of the optical modules be arranged in parallel in a direction parallel to a fast axis of light emitted by the light emitting element, and a surface not perpendicular to a parallel direction of the plurality of optical modules among outer peripheral surfaces of the respective optical modules be fixed to a fixing member.

In the optical module including the plurality of light emitting elements, the lights emitted from the plurality of light emitting elements may be superposed on the fast axis and guided to the outside. Further, in the optical module, the size in a direction parallel to a direction in which the lights emitted from the plurality of light emitting elements are overlaid tends to be smaller than the size in a direction perpendicular to the overlaid direction. Thus, by arranging the plurality of optical modules in parallel in the direction parallel to the fast axis of the light emitted from the light emitting element, the surface not perpendicular to the parallel direction of the plurality of optical modules among the outer peripheral surfaces of the respective optical modules tends to be smaller than a surface perpendicular to the parallel direction. Thus, when the plurality of optical modules are arranged in parallel in this way, the surface not perpendicular to the parallel direction of the plurality of optical modules among the outer peripheral surfaces of the respective optical modules is fixed to the fixing member, so that an installation area of the optical module unit can be reduced.

As described above, one or more embodiments of the present invention include an optical module unit capable of suppressing variations in cooling efficiency of a plurality of optical modules, and a laser device including the optical module unit.

DETAILED DESCRIPTION

Figure 1:
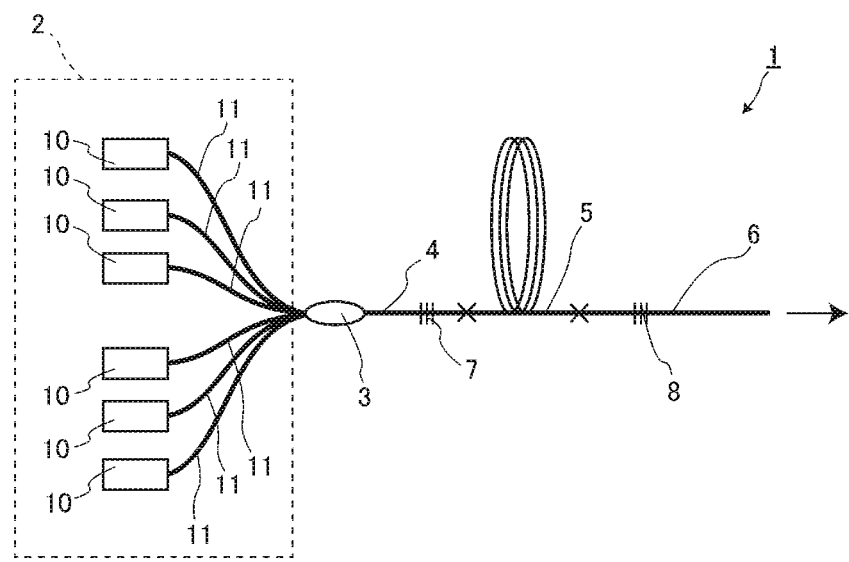
FIG. 1 is a diagram showing a configuration of a laser device according to one or more embodiments of the present invention.

An optical module according to one or more embodiments of the present invention will be explained in detail hereinafter referring to the drawings.

FIG. 1 is a diagram showing a configuration of a laser device according to one or more embodiments of the present invention. As shown in FIG. 1, a laser device 1 of one or more embodiments is a fiber laser device including, as main components, a pumping light source 2, an optical combiner 3, an amplification optical fiber 5, an optical fiber 4 connected to one side of the amplification optical fiber 5, a first FBG (Fiber Bragg Grating) 7 provided in the optical fiber 4, an optical fiber 6 connected to the other side of the amplification optical fiber 5, and a second FBG 8 provided in the optical fiber 6. In the laser device 1, the amplification optical fiber 5, the first FBG 7, and the second FBG 8 form a resonator.

Figure 2:
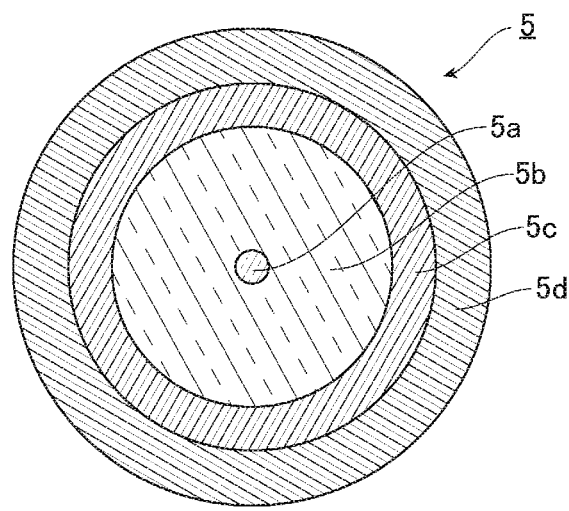
FIG. 2 is a diagram showing a state of a cross section perpendicular to a longitudinal direction of an amplification optical fiber shown in FIG. 1.

FIG. 2 is a diagram showing a state of a cross section perpendicular to a longitudinal direction of the amplification optical fiber 5 shown in FIG. 1. As shown in FIG. 2, the amplification optical fiber 5 includes, as main components, a core 5a, an inner cladding 5b that surrounds an outer peripheral surface of the core 5a without a gap, an outer cladding 5c that covers an outer peripheral surface of the inner cladding 5b, and a covering layer 5d that covers the outer cladding 5c and has a so-called double clad structure. A refractive index of the inner cladding 5b is lower than that of the core 5a, and a refractive index of the outer cladding 5c is lower than that of the inner cladding 5b.

Examples of the material forming the core 5a include elements such as germanium (Ge) that increases the refractive index, and quartz added with an active element such as ytterbium (Yb) that is pumped by pumping light emitted from the pumping light source 2. Examples of such active elements include rare earth elements, and examples of the rare earth elements include the above-mentioned Yb, thulium (Tm), cerium (Ce), neodymium (Nd), europium (Eu), and erbium (Er). Further examples of the active element include bismuth (Bi) in addition to the rare earth elements.

Examples of the material forming the inner cladding 5b include pure quartz to which no dopant is added. An element such as fluorine (F) that lowers the refractive index may be added to the material of the inner cladding 5b. The outer cladding 5c is formed of resin or quartz. Examples of such a resin include an ultraviolet curable resin, and examples of quartz include a quartz added with a dopant such as fluorine (F) that lowers the refractive index so that the refractive index becomes lower than that of the inner cladding 5b. Examples of the material forming the covering layer 5d include an ultraviolet curable resin, and when the outer cladding 5c is a resin, an ultraviolet curable resin different from the resin forming the outer cladding is used.

The optical fiber 4 connected to one side of the amplification optical fiber 5 includes, as main components, a core to which no active element is added, an inner cladding that surrounds an outer peripheral surface of the core without a gap, outer cladding that covers an outer peripheral surface of the inner cladding, and a covering layer that covers the outer cladding. The core of the optical fiber 4 has substantially the same configuration as the core 5a of the amplification optical fiber 5 except that no active element is added. The core of the optical fiber 4 is connected to the core 5a of the amplification optical fiber 5, and the inner cladding of the optical fiber 4 is connected to the inner cladding 5b of the amplification optical fiber 5. The core of the optical fiber 4 is provided with the first FBG 7 as a first mirror. Thus, the first FBG 7 is optically coupled to the core 5a of the amplification optical fiber 5 on one side of the amplification optical fiber 5. In the first FBG 7, a portion where the refractive index periodically increases along a longitudinal direction of the optical fiber 4 is repeated, and the first FBG 7 is configured such that by adjusting this period, light of at least a part of the wavelength of light emitted by the active element of the amplification optical fiber 5 in a pumped state is reflected. A reflectance of the first FBG 7 is higher than a reflectance of the second FBG 8 described later, and the first FBG 7 reflects light of a desired wavelength of the light emitted by the active element at 99% or more, for example. The wavelength of light reflected by the first FBG 7 is set to, for example, 1090 nm when the active element is ytterbium as described above.

The optical fiber 6 connected to the other side of the amplification optical fiber 5 includes, as main components, a core to which no active element is added, a cladding that surrounds an outer peripheral surface of the core without a gap, and a covering layer that covers an outer peripheral surface of the cladding. The core of the optical fiber 6 is connected to the core 5a of the amplification optical fiber 5, and the cladding of the optical fiber 6 is connected to the inner cladding 5b of the amplification optical fiber 5. The core of the optical fiber 6 is provided with the second FBG 8 as a second mirror. Thus, the second FBG 8 is optically coupled to the core 5a of the amplification optical fiber 5 on the other side of the amplification optical fiber 5. In the second FBG 8, a portion where the refractive index becomes high at a certain time cycle along the longitudinal direction of the optical fiber 6 is repeated, and the second FBG 8 is configured such that light of at least a part of the wavelength of the light reflected by the first FBG 7 is reflected at a reflectance lower than the reflectance of the first FBG 7. The second FBG 8 reflects the light of at least a part of the wavelength of the light reflected by the first FBG 7 at a reflectance of 5% to 50%, for example. In one or embodiments, more although nothing is particularly connected to the other end of the optical fiber 6 opposite to the amplification optical fiber 5 side, a glass rod or the like having a diameter larger than the core diameter of the optical fiber 6 may be connected.

Next, the pumping light source 2 will be described.

The pumping light source 2 includes a plurality of optical module units 10 and an optical fiber 11 connected to each of the optical module units 10. A core of each of the optical fibers 11 is connected to the inner cladding of the optical fiber 4 in the optical combiner 3. Therefore, the optical fiber 11 through which the pumping light emitted from each of the optical module units 10 propagates and the inner cladding 5b of the amplification optical fiber 5 are optically coupled via the inner cladding of the optical fiber 4.

Figure 3:
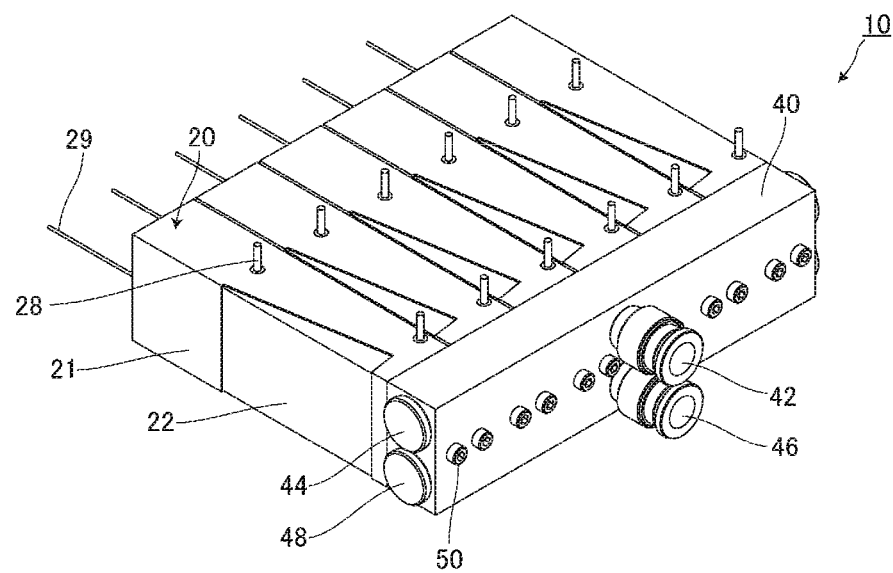
FIG. 3 is a perspective view of an optical module unit shown in FIG. 1.
Figure 4:
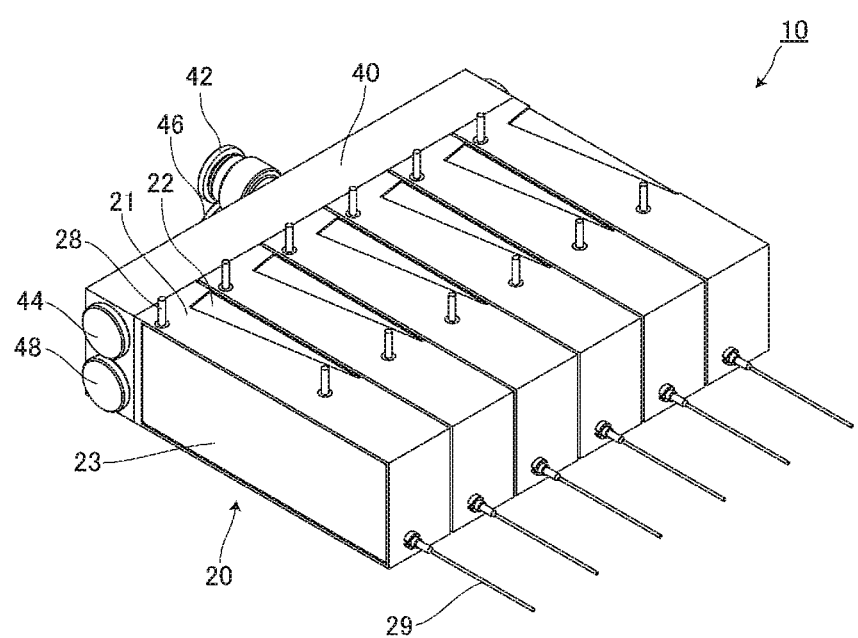
FIG. 4 is a perspective view of the optical module unit viewed from a direction different from that of FIG. 3.
Figure 5:
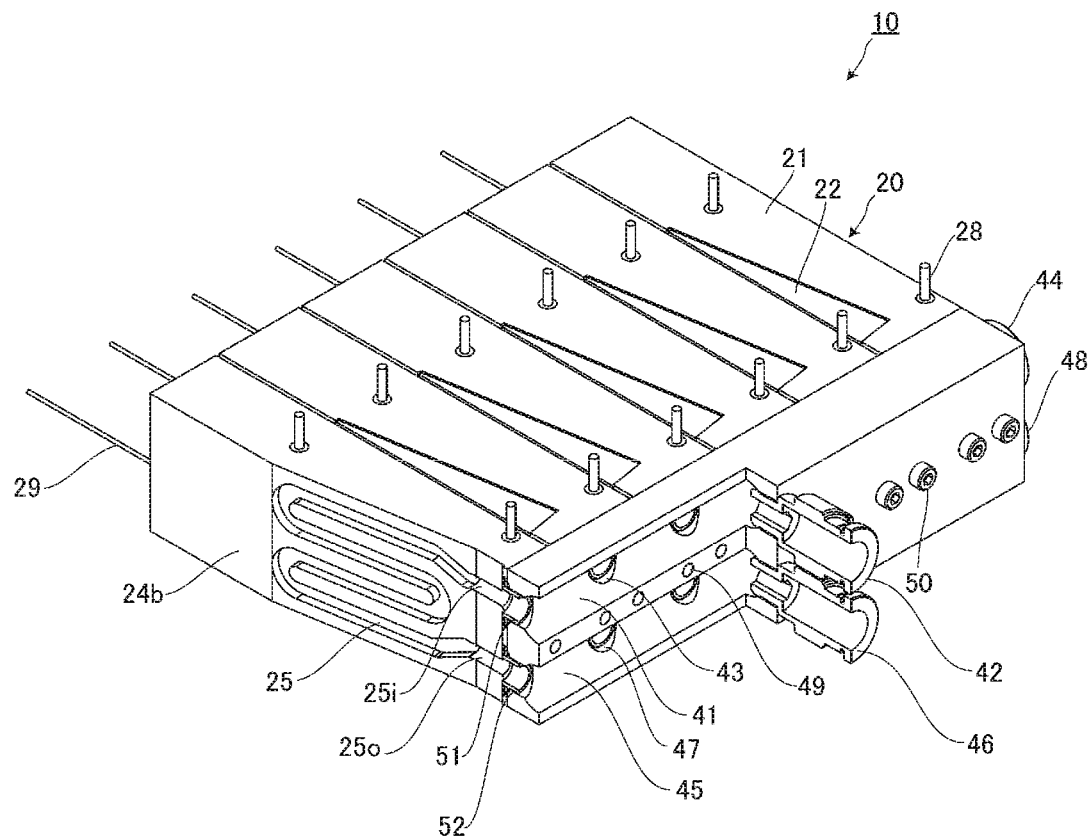
FIG. 5 is a view showing a part of the optical module unit shown in FIG. 3 in a cut-away state.

FIG. 3 is a perspective view of the optical module unit 10 shown in FIG. 1, and FIG. 4 is a perspective view of the optical module unit 10 viewed from a direction different from that of FIG. 3. FIG. 5 is a view showing a part of the optical module unit 10 shown in FIG. 3 in a cut-away state in which one bottom lid 22 is omitted. In FIGS. 3 to 5 and other figures below, when components having similar configurations are shown in the same figure, for the sake of visibility, in some cases, only one of the components may be provided with a reference numeral, and reference numerals may be omitted for the other components.

As shown in FIGS. 3 to 5, the optical module unit 10 includes a plurality of optical modules 20 and a manifold 40. Although the number of optical modules 20 is not particularly limited, the optical module unit 10 of one or more embodiments includes the six optical modules 20. The optical modules 20 adjacent to each other are arranged in parallel so as to be spaced apart from each other. In addition, each of the optical modules 20 is fixed to the manifold 40 by a bolt 50.

The optical module 20 will be described in detail below.

The optical module 20 includes a housing body 21, an optical component to be described later, housed in the housing body 21, a top lid 23 that covers a space in which the optical component is housed, the bottom lid 22 that covers a side opposite to the top lid 23 of the housing body 21, and a connector 28 for supplying electric power to some optical components. The bottom lid 22 and the top lid 23 are named for the sake of convenience, and do not mean that the bottom lid 22 is located at a bottom and the top lid 23 is located at a top when the optical module 20 is installed.

The top lid 23 is formed from a metal plate and is fixed to the housing body 21 by adhesion or the like. The bottom lid 22 is a triangular columnar body made of metal, and is fitted into a recess formed in the housing body 21 to be described later and fixed to the housing body 21 with an adhesive or the like. By combining the housing body 21, the bottom lid 22, and the top lid 23, the outer shape of the optical module 20 is made to have a substantially rectangular parallelepiped.

Figure 6:
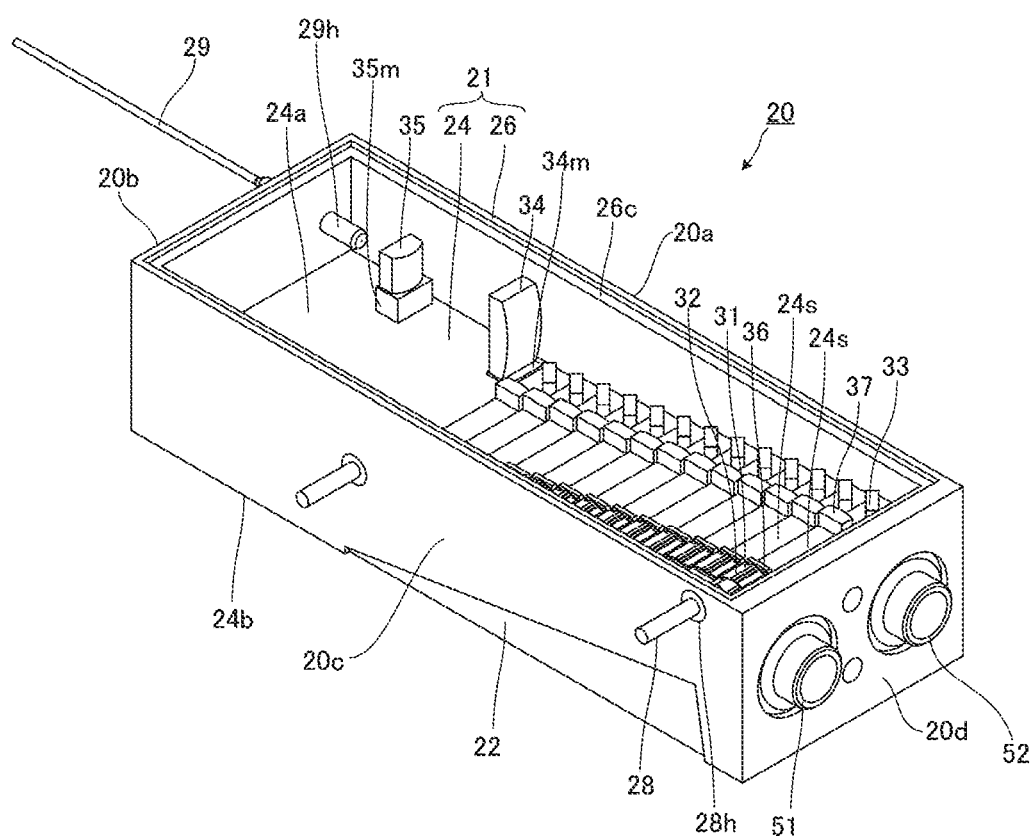
FIG. 6 is a perspective view of the optical module shown in FIG. 3.
Figure 7:
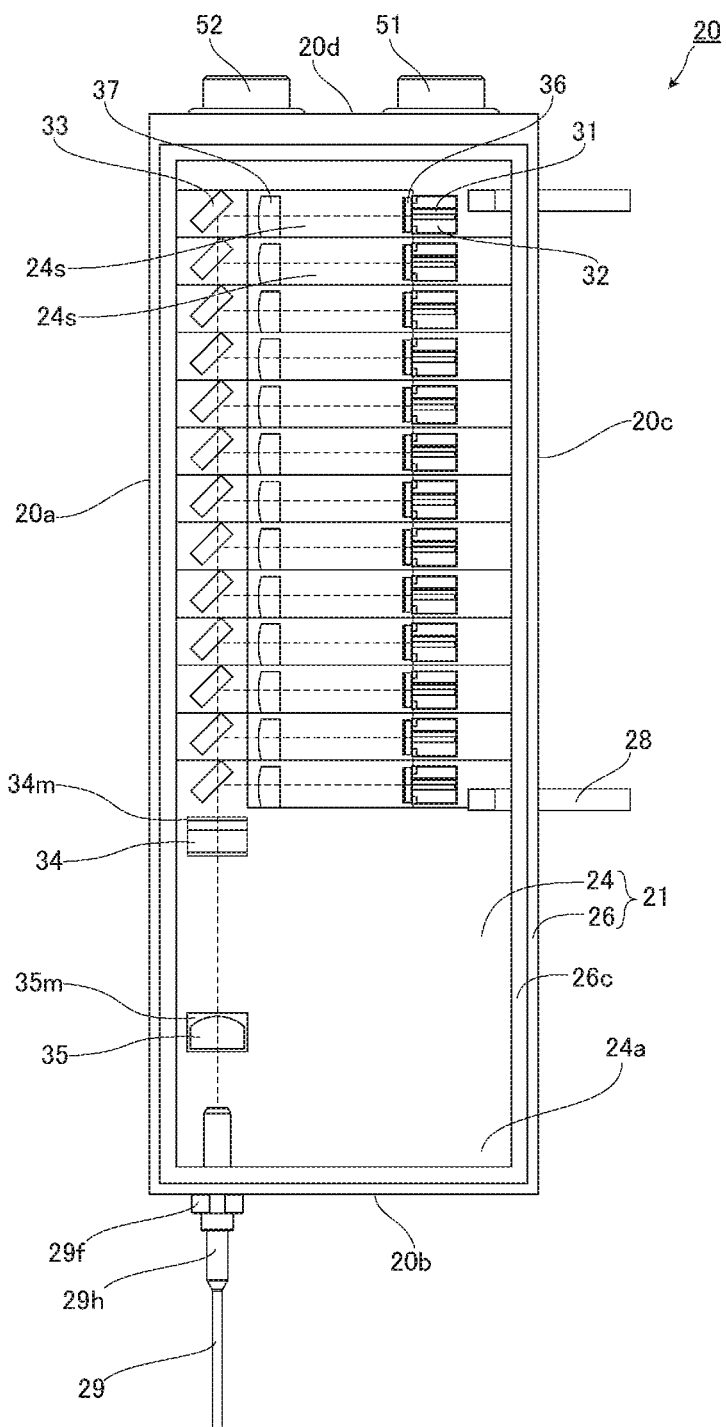
FIG. 7 is a plan view of the optical module shown in FIG. 3.

FIG. 6 is a perspective view of the optical module 20 shown in FIG. 3, and FIG. 7 is a plan view of the optical module 20. In FIG. 7, an optical path of light emitted by a laser diode 31, which is a light emitting element, is indicated by a broken line. In FIGS. 6 and 7, the top lid 23 is omitted in order to show the arrangement of the optical component clearly.

As shown in FIG. 6, the housing body 21 of one or more embodiments includes a mount 24 and a frame body 26 that is integrated with the mount 24 and surrounds an outer periphery of the mount 24.

Figure 8:
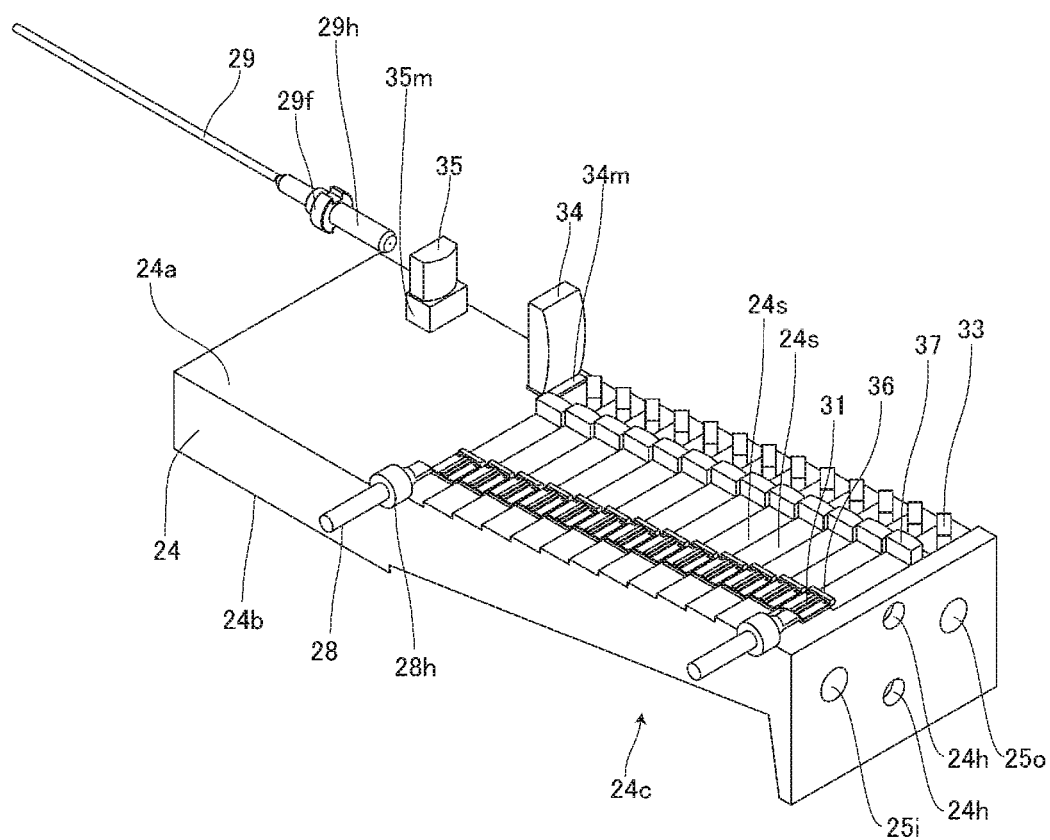
FIG. 8 is a view in which a frame body and a bottom lid are omitted from FIG. 6.

FIG. 8 is a view in which the frame body 26 is omitted from FIG. 6 and the bottom lid 22 is also omitted in order to show the structure of the mount 24 and the arrangement of the optical component more clearly.

As shown in FIGS. 6 to 8, the mount 24 has one surface 24a that is a surface on a side on which the optical component is disposed and the other surface 24b that is the opposite surface. On the one surface 24a side of the mount 24, a plurality of element arrangement surfaces 24s arranged in parallel with each other are formed in a stepped shape. A portion of the other surface 24b of the mount 24, which overlaps with the plurality of element arrangement surfaces 24s, formed in a stepped shape, in a thickness direction is an inclined surface that is inclined to the same degree as the inclination of the step. That is, the inclination of the inclined surface with respect to the element arrangement surface 24s and the inclination of the step formed by the plurality of element arrangement surfaces 24s are approximately the same. By forming the inclined surface on the other surface 24b of the mount 24 in this way, a recess 24c is formed as shown in FIG. 8. The bottom lid 22 is fitted into the recess 24c and fixed to the housing body 21 with an adhesive or the like.

As shown in FIG. 5, a sub-passage 25 is formed on the above-mentioned inclined surface formed on the other surface 24b of the mount 24. The sub-passage 25 is a passage that is bent plural times, extends, and has an inlet 25i at one end and an outlet 25o at the other end. The inlet 25i and the outlet 25o of the sub-passage 25 are formed on the same surface of the mount 24. The sub-passage 25 is formed to be inclined with respect to the element arrangement surface 24s so that an average of shortest distances between the respective laser diodes 31 and the sub-passage 25 is smaller than that in a case where the sub-passage 25 is formed in parallel to the element arrangement surface 24s. In one or more embodiments, thirteen laser diodes 31 are provided. Thus, a shortest distance between each of the thirteen laser diodes 31 and the sub-passage 25 is obtained, and a value obtained by dividing a sum of the shortest distances by 13 is the average of the shortest distances between the respective laser diodes 31 and the sub-passage 25. A joint 51 is attached to the inlet 25i of the sub-passage 25, and a joint 52 is attached to the outlet 25o of the sub-passage 25. A cooling medium such as water flows through the sub-passage 25 having such a configuration to cool the mount 24. By covering the sub-passage 25 with the bottom lid 22, leakage of the cooling medium from the sub-passage 25 is suppressed.

As shown in FIG. 8, the mount 24 has a screw hole 24h into which the bolt 50 is screwed, on the surface on a side where the manifold 40 is disposed. The two screw holes 24h of one or more embodiments are formed with a predetermined interval.

Since the mount 24 as described above functions as a heat sink which is described below, the mount 24 is preferably formed of a metal such as copper having high thermal conductivity.

Next, the structure of the frame body 26 will be described. The frame body 26 has a cut-out 26c on an inner peripheral surface side over the entire circumference at an end on a side where the top lid 23 is disposed. An outer peripheral portion of the top lid 23 is fitted into the cut-out 26c. The frame body 26 has a through hole for guiding an optical fiber 29 from the inside of the housing body 21 to the outside of the housing body 21, a through hole for guiding the connector 28 from the inside of the housing body 21 to the outside of the housing body 21, a through hole for passing the bolt 50, a through hole for disposing the joint 51 attached to the inlet 25i of the sub-passage 25, and a through hole for disposing the joint 52 attached to the outlet 25o of the sub-passage 25.

Next, the optical component housed in the housing body 21 will be described. In the optical module 20 of one or more embodiments, the optical components arranged on the one surface 24a side of the mount 24 include the laser diode 31, a first collimator lens 36, a second collimator lens 37, a mirror 33, and a first light-collecting lens 34, a second light-collecting lens 35, and the optical fiber 29. The optical fiber 29 has one end housed in the housing body 21 and the other end disposed outside the housing body 21.

The plurality of laser diodes 31 are arranged one by one on each step of the stepped-shaped element arrangement surface 24s formed on the one surface 24a of the mount 24 as described above. Each of the laser diodes 31 is an element having a Fabry-Perot structure formed by stacking a plurality of semiconductor layers including an active layer, and is disposed such that a stacking direction of the plurality of semiconductor layers is perpendicular to an installation surface. Thus, the laser diode 31 emits laser light in which a direction perpendicular to the installation surface of the laser diode 31 is the fast axis and a direction parallel to the installation surface of the laser diode 31 is the slow axis. In one or more embodiments, each of the laser diodes 31 is fixed on a laser mount 32 by soldering or the like, and is fixed to the mount 24 via the laser mount 32. Each of the laser diodes 31 emits laser light having a wavelength of 900 nm band, for example.

The laser mount 32 is a table for adjusting a height of the laser diode 31, and each of the laser mounts 32 is fixed to the mount 24 by, for example, soldering or the like. Although the laser mount 32 may be provided separately from the mount 24 as described above, and may be fixed on the mount 24, the laser mount 32 may be integrally molded with the mount 24. Alternatively, if the height adjustment of the laser diode 31 is unnecessary, the laser mount 32 may be omitted.

Figure 9:
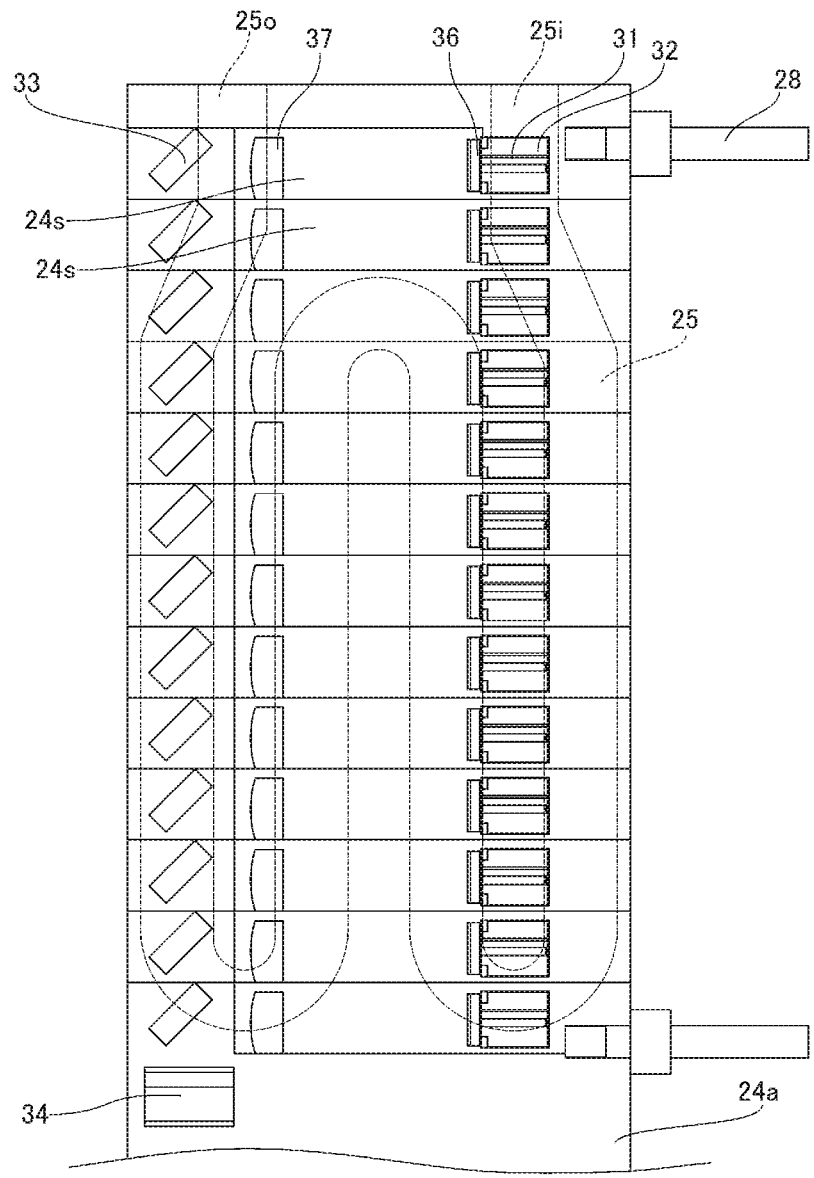
FIG. 9 is a view showing a part of the optical module shown in FIG. 7, and also showing a sub-passage in a broken line in perspective.

FIG. 9 is a view showing a part of the optical module 20 shown in FIG. 7 and also showing the sub-passage 25 in a broken line in perspective, and is a view showing a relationship between arrangement of the plurality of laser diodes 31 and the sub-passage 25. As shown in FIG. 9, some of the plurality of laser diodes 31 are arranged at positions that do not overlap with a central axis of the sub-passage 25 in a direction perpendicular to the installation surface of the laser diode 31. That is, in one or more embodiments, some of the plurality of laser diodes 31 do not overlap with the central axis of the sub-passage 25 in the thickness direction of the mount 24.

The first collimator lens 36 is a lens that collimates light in a fast axis direction of light emitted from the laser diode 31. The first collimator lens 36 is fixed on the laser mount 32 by a resin or the like so that a relative position to the laser diode 31 is fixed.

The second collimator lens 37 is a lens that collimates light in a slow axis direction of the light emitted from the laser diode 31. The second collimator lens 37 is fixed to the mount 24 by adhesion or the like.

Each of the mirrors 33 is provided on a light emitting direction side in each of the laser diodes 31 corresponding to the mirror 33, and one mirror 33 is provided for one laser diode 31. Therefore, each of the mirrors 33 can directly reflect the light emitted from the laser diode 31 and collimated. The mirror 33 of one or more embodiments having such a configuration is a glass body having a reflective surface formed on its surface by a reflective film formed of, for example, a dielectric multilayer film. The reflective surface may be formed of a metal film.

The first light-collecting lens 34 is a lens that collects the light, reflected by each of the mirrors 33, in the fast axis direction, and is composed of a cylindrical lens. The first light-collecting lens 34 is fixed to the mount 24 via a lens mount 34m. The lens mount 34m is a table for adjusting a height of the first light-collecting lens 34, and the first light-collecting lens 34 is fixed to the lens mount 34m by adhesion or the like, and the lens mount 34m is fixed to the mount 24 by adhesion or the like. The lens mount 34m may be integrally molded with the mount 24, and if the height adjustment of the first light-collecting lens 34 is unnecessary, the lens mount 34m may be omitted.

The second light-collecting lens 35 is a lens that collects the light, emitted from the first light-collecting lens 34, in the slow axis direction, and is composed of a cylindrical lens. The second light-collecting lens 35 is fixed to the mount 24 via a lens mount 35m. The lens mount 35m is a table for adjusting a height of the second light-collecting lens 35, and the second light-collecting lens 35 is fixed to the lens mount 35m by adhesion or the like, and the lens mount 35m is fixed to the mount 24 by adhesion or the like. The lens mount 35m may be integrally molded with the mount 24, and if the height adjustment of the second light-collecting lens 35 is unnecessary, the lens mount 35m may be omitted.

If the lights emitted from the first light-collecting lens 34 and the second light-collecting lens 35 are not collected at a desired position, another light-collecting lens may be further disposed on the mount 24.

The optical fiber 29 is inserted through a pipe-shaped holder 29h and fixed to the holder 29h. The holder 29h is fixed to a ring-shaped fixing member 29f as shown in FIGS. 7 and 8, and the fixing member 29f is fixed to the frame body 26 of the housing body 21. One end of the optical fiber 29 is located at a position where the light emitted from the second light-collecting lens 35 can enter a core of the optical fiber 29. In one or more embodiments, the optical fiber 29 is fixed to the holder 29h by an adhesive or soldering, the holder 29h is fixed by being adhered to the fixing member 29f, and the fixing member 29f is fixed by being adhered to the frame body 26.

The optical fiber 29 of each of the optical modules 20 is connected to an optical combiner (not shown), and is optically coupled to the optical fiber 11 shown in FIG. 1 via the optical combiner.

The connector 28 is formed of a pair of rod-shaped conductors, and each of the conductors is fixed to a connector holder 28h. Each of the connector holders 28h is adhered and fixed to the frame body 26 of the housing body 21. One conductor of the connector 28 is connected to the laser diode 31 closest to the one conductor by a gold wire (not shown), and each of the laser diodes 31 is daisy-chain connected by a gold wire (not shown). The other conductor of the connector 28 is connected to the laser diode 31 closest to the other conductor by a gold wire (not shown).

The plurality of optical modules 20 described above are arranged in parallel and fixed to the manifold 40, as shown in FIGS. 3 to 5. In each of the optical modules 20, a surface where the optical fiber 29 is fixed and a surface fixed to the manifold 40 face each other. The surface of the optical module 20 fixed to the manifold 40 is the smallest surface when the optical module 20 is regarded as a substantially rectangular parallelepiped. A direction in which the optical modules 20 of one or more embodiments are arranged in parallel is a direction orthogonal to a plane where the laser diode 31 is disposed. As described above, since the laser diode 31 emits light in which the direction orthogonal to the plane where the laser diode 31 is disposed is the fast axis, the direction in which the optical modules 20 of one or more embodiments are arranged in parallel is a direction parallel to the fast axis of the light emitted from the laser diode 31. Among outer peripheral surfaces of the respective optical modules 20, the surface not perpendicular to the parallel direction of the plurality of optical modules 20 is fixed to a fixing member (not shown). In one or more embodiments, among the outer peripheral surfaces of the optical module 20 shown in FIGS. 6 and 7, a side surface 20a parallel to the parallel direction of the plurality of optical modules 20 is fixed to the fixing member (not shown). The side surface 20a is a side surface between a side surface 20d to which the manifold 40 is fixed and a side surface 20b from which the optical fiber 29 is led out among the outer peripheral surfaces of the optical module 20, and is a surface that faces a side surface 20c from which the connector 28 is led out among the outer peripheral surfaces of the optical module 20. The side surface 20a is a surface having a smaller area than the one surface 24a and the other surface 24b of the mount 24. That is, the side surface 20a has a smaller area than the outer peripheral surface of the optical module 20 constituted by the top lid 23, and has a smaller area than the outer peripheral surface of the optical module 20 constituted by a portion of the other surface 24b of the mount 24 and the bottom lid 22.

Next, the manifold 40 will be described in detail.

Figure 10:
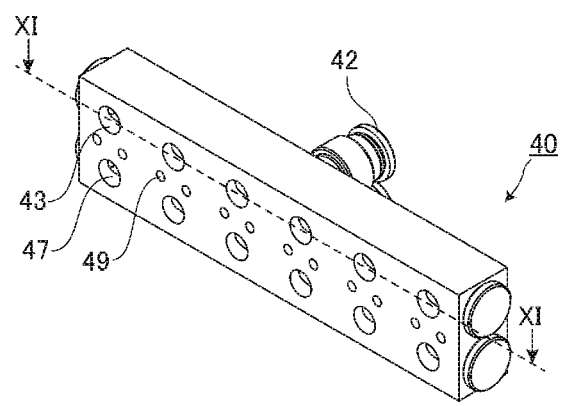
FIG. 10 is a perspective view of a manifold shown in FIG. 3 viewed from a side where the optical module is fixed.
Figure 11:
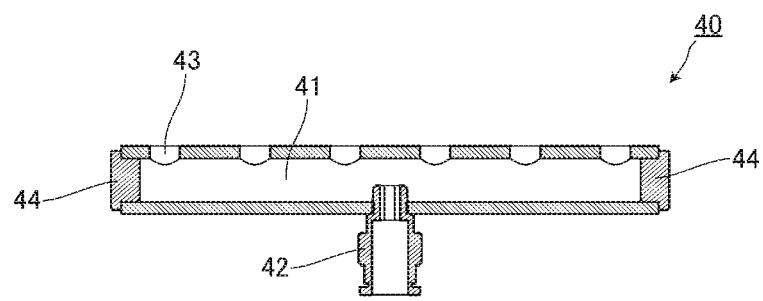
FIG. 11 is a cross-sectional view of the manifold taken along a line XI-XI shown in FIG. 10.

FIG. 10 is a perspective view of the manifold 40 shown in FIGS. 3 to 5 viewed from a side where the optical module 20 is fixed, and FIG. 11 is a cross-sectional view of the manifold 40 taken along a line XI-XI shown in FIG. 10.

As shown in FIG. 5, the manifold 40 has a first main passage 41 and a second main passage 45 through which the cooling medium flows. FIG. 11 shows a cross section parallel to the longitudinal direction of the first main passage 41. The first main passage 41 is a passage through which the cooling medium supplied to the sub-passage 25 of the optical module 20 flows. The second main passage 45 is a passage through which the cooling medium after flowing through the sub-passage 25 of the optical module 20 flows. Since the shape of the second main passage 45 is the same as the shape of the first main passage 41, a cross section parallel to a longitudinal direction of the second main passage 45 is not shown.

As shown in FIG. 11, the first main passage 41 is formed in a straight line. A through hole is formed in a side surface of a central portion of the first main passage 41 in the longitudinal direction, and a joint 42 is attached to the through hole. The joint 42 is formed in a tubular shape, and the cooling medium flows into the first main passage 41 from the outside through the joint 42. A plurality of through holes 43 are formed on a side surface of the first main passage 41 opposite to the side where the joint 42 is provided. By inserting the joint 51 attached to each of the optical modules 20 into each of the through holes 43, the first main passage 41 and the inlet 25$i$ of the sub-passage 25 of each of the optical modules 20 are connected. That is, the sub-passage 25 included in each of the optical modules 20 is connected in parallel by the first main passage 41. The sub-passage 25 included in each of the optical modules 20 is connected to the first main passage 41 on the surface side where the optical module 20 is fixed to the manifold 40. In addition, both longitudinal ends of the first main passage 41 are closed by a lid member 44, so that leakage of the cooling medium from the first main passage 41 can be suppressed.

The second main passage 45 is formed in a linear shape similar to the first main passage 41. A through hole is formed in a side surface of a central portion of the second main passage 45 in the longitudinal direction, and a joint 46 is attached to the through hole. The joint 46 is formed in a tubular shape, and the cooling medium flows out from the second main passage 45 to the outside through the joint 46. A plurality of through holes 47 are formed on a side surface of the second main passage 45 opposite to the side where the joint 46 is provided. By inserting the joint 52 attached to each of the optical modules 20 into each of the through holes 47, the second main passage 45 and the outlet 25$o$ of the sub-passage 25 of each of the optical modules 20 are connected. That is, the sub-passage 25 included in each of the optical modules 20 is connected in parallel by the second main passage 45. The sub-passage 25 included in each of the optical modules 20 is connected to the second main passage 45 on the surface side where the optical module 20 is fixed to the manifold 40. Both longitudinal ends of the second main passage 45 are closed by a lid member 48, so that leakage of the cooling medium from the second main passage 45 can be suppressed.

As shown in FIG. 10, the manifold 40 has a plurality of through holes 49 penetrating from a side where the optical module 20 is disposed to the opposite side between the first main passage 41 and the second main passage 45. The bolts 50 are inserted through these through holes 49.

Next, the operation of the laser device 1 will be described.

When desired power is supplied from the connector 28 to each of the laser diodes 31 in each of the optical modules 20, each of the laser diodes 31 emits light, as shown in FIG. 7. This light is, for example, laser light having a wavelength of 900 nm band as described above. In the light emitted from each of the laser diodes 31, the fast axis direction is the direction orthogonal to the plane where each of the laser diodes 31 is disposed, and the slow axis direction is a direction parallel to the plane. The light emitted from each of the laser diodes 31 enters the first collimator lens 36. The first collimator lens 36 collimates the light emitted from the laser diode 31 in the fast axis direction and emits the light. The second collimator lens 37 collimates the light emitted from the first collimator lens 36 in the slow axis direction and emits the light. The light emitted from the second collimator lens 37 enters the mirror 33 and is reflected by the mirror 33. The light reflected by each of the mirrors 33 in this way enters the first light-collecting lens 34.

In the light entering the first light-collecting lens 34, the light in the fast axis direction is collected as described above. The light emitted from the first light-collecting lens 34 enters the second light-collecting lens 35, and the light in the slow axis direction is collected by the second light-collecting lens 35. The light collected by the second light-collecting lens 35 enters the core of the optical fiber 29 and propagates through the optical fiber 29.

Thus, in each of the optical modules 20, the lights emitted by the plurality of laser diodes 31 propagate through the optical fiber 29. The light propagating through each of the optical fibers 29 enters the optical fiber 11 shown in FIG. 1 by an optical combiner (not shown). In this way, light that becomes the pumping light is emitted from the pumping light source 2.

When each of the optical modules 20 of the pumping light source 2 emits pumping light as described above, this pumping light enters the inner cladding 5$b$ of the amplification optical fiber 5 via the inner cladding of the optical fiber 4. The inner cladding 5$b$ is pinched between the core 5$a$ having a higher refractive index than the inner cladding 5$b$ and the outer cladding 5$c$ having a lower refractive index than the inner cladding 5$b$, and the pumping light entering the inner cladding 5$b$ propagates mainly through the inner cladding 5$b$ and enters the core 5$a$. Thus, the pumping light entering the core 5$a$ pumps the active element added to the core 5$a$. The pumped active element emits spontaneous emission light having a specific wavelength. For example when the active element is ytterbium, the spontaneous emission light at this time is light including a wavelength of 1090 nm and having a constant wavelength band. This spontaneous emission light propagates through the core 5$a$ of the amplification optical fiber 5, light of a part of the wavelength is reflected by the first FBG 7, and of the light thus reflected, the light of the wavelength reflected by the second FBG 8 is reflected by the second FBG 8 and reciprocates in the resonator. Then, when the light reflected by the first FBG 7 and the second FBG 8 propagates through the core 5$a$ of the amplification optical fiber 5, stimulated emission occurs, and this light is amplified. When the gain and loss in the resonator become equal, a laser oscillation state is established. Then, a portion of light that resonates between the first FBG 7 and the second FBG 8 passes through the second FBG 8 and is emitted from an end of the optical fiber 6.

At this time, the cooling medium is supplied to the first main passage 41 of the manifold 40 via the joint 42. The cooling medium is branched in the first main passage 41, and is supplied from the inlet 25$i$ to each of the sub-passages 25 via the joint 51 connected to each of the optical modules 20. The cooling medium that has flowed through the sub-passage 25 of each of the optical modules 20 and has received heat from the mount 24 is discharged from the outlet 25$o$. The cooling medium that has flowed through the sub-passage 25 of each of the optical modules 20 in this way flows into the second main passage 45 of the manifold 40 via the joint 52, and discharged outside the optical module unit 10 via the joint 46. The cooling medium discharged from the optical module unit 10 may be returned from the joint 42 to the first main passage 41 by being cooled and circulated, and may be used for cooling other components such as the optical combiner included in the laser device 1.

As described above, the laser device 1 of one or more embodiments includes the optical module unit 10 and the amplification optical fiber 5 that amplifies the light emitted by the optical module unit 10.

The optical module unit 10 of one or more embodiments includes the plurality of optical modules 20 and the manifold 40. Each of the optical modules 20 includes the laser diode 31 which is a plurality of light emitting elements, the mount 24 in which the plurality of laser diodes 31 are arranged on the one surface 24a side, and the sub-passage 25 formed in the mount 24. In the manifold 40, the plurality of optical modules 20 are fixed, and the manifold 40 has the first main passage 41 which connects one end of the sub-passage 25, included in each of the optical modules 20, in parallel and through which the cooling medium supplied to each of the sub-passages 25 flows.

As described above, each of the optical modules 20 has the sub-passage 25, and by making the cooling medium flow through the sub-passage 25, the heat generated by the laser diode 31 is transferred to the cooling medium via the mount 24, so that the laser diode 31 can be cooled. That is, the mount 24 functions as a heat sink, and the heat generated by the laser diode 31 which is a heat source is transferred to the cooling medium via the heat sink. The sub-passage 25 included in each of the optical modules 20 is connected in parallel to the first main passage 41 of the manifold 40. Thus, the cooling medium that does not flow through the sub-passages 25 of the other optical modules 20 and is not heated by the other optical modules 20 can be supplied to each of the optical modules 20 through the first main passage 41. Thus, it can be suppressed that the temperature of the cooling medium supplied to each of the optical modules 20 becomes non-uniform. Therefore, according to the optical module unit 10 of one or more embodiments, it is possible to suppress variations in cooling efficiency of the plurality of optical modules 20.

The optical module unit 10 of one or more embodiments includes the second main passage 45 that connects the other end of the sub-passage 25 included in each of the optical modules 20 in parallel. By connecting the other end of the respective sub-passage 25 in parallel to the second main passage 45, the cooling medium flowing out from the plurality of sub-passages 25 can be made to flow into the second main passage 45 for batch processing. Thus, for example, the cooling medium once flowing through the sub-passage 25 is allowed to flow into the second main passage to be recovered and then cooled, so that the cooling medium can be reused easily.

The first main passage 41 and the second main passage 45 of one or more embodiments are formed in the manifold 40. The optical module unit 10 can be downsized by forming both the first main passage 41 and the second main passage 45 in the manifold 40.

The mount 24 has a plurality of element arrangement surfaces 24s parallel to each other, and the plurality of laser diodes 31 are arranged on the respective element arrangement surfaces 24s. In addition, the sub-passage 25 is formed to be inclined with respect to the element arrangement surface 24s so that the average of shortest distances between the respective laser diodes 31 and the sub-passage 25 is smaller than that in the case where the sub-passage 25 is formed parallel to the element arrangement surface 24s. The plurality of element arrangement surfaces 24s parallel to each other are formed in a stepped shape, and when the laser diode 31 is disposed on the stepped-shaped element arrangement surface 24s having such a configuration, the sub-passage 25 is formed to be inclined with respect to the element arrangement surface 24s as described above, so that it can be suppressed that the distance between the respective laser diodes 31 and the sub-passage 25 become uneven. Thus, variations in cooling efficiency of each of the laser diodes 31 can be suppressed.

At least some of the plurality of laser diodes 31 are arranged at positions that do not overlap with the central axis of the sub-passage 25 in the direction perpendicular to the installation surface of the laser diode 31. The laser diode 31 and the central axis of the sub-passage 25 do not overlap with each other in the direction perpendicular to the installation surface of the laser diode 31, so that as compared with a case where the laser diode 31 and the central axis of the sub-passage 25 overlap with each other, a heat conduction path from the laser diode 31 in the mount 24 to the sub-passage 25 can be lengthened. Thus, the heat generated by the laser diode 31 is easily diffused in the mount 24 functioning as a heat sink as described above, and the laser diode 31 can be cooled efficiently.

Each of the optical modules 20 has the optical fiber 29 that guides the light, emitted from the plurality of the laser diodes 31, to the outside, and a surface that faces a surface where the optical fiber 29 of each of the optical modules 20 is disposed be fixed to the manifold 40. The side surface 20d that faces the side surface 20b where the optical fiber 29 is disposed is fixed to the manifold 40, so that as compared with a case where other surfaces among the outer peripheral surfaces of the optical module 20 are fixed to the manifold 40, relative displacement between an optical axis of light entering the optical fiber 29 and an optical axis of the optical fiber 29 can be suppressed. Specifically, the side surface 20d is fixed to the manifold 40, so that as compared with a case where the manifold 40 is fixed to the side surface 20a and the side surface 20c, the position of each of the mirrors 33 is difficult to be displaced even if the optical module 20 warps due to a difference in thermal expansion coefficient between the manifold 40 and the optical module 20, or other factors. Thus, a relative positional displacement between each of the mirrors 33 and the optical fiber 29 is suppressed, and the relative displacement between the optical axis of the light entering the optical fiber 29 and the optical axis of the optical fiber 29 can be suppressed as described above. Thus, it is possible to suppress a decrease in efficiency of guiding the light emitted by the plurality of laser diodes 31 to the outside.

The sub-passage 25 included in each of the optical modules 20 is connected to the first main passage 41 and the second main passage 45 on the surface side where the optical module 20 is fixed to the manifold 40. By connecting the sub-passage 25 of the optical module 20 to the first main passage 41 and the second main passage 45 of the manifold 40 on a surface side where the optical module 20 and the manifold 40 are fixed, the sub-passage 25 and the first main passage 41 can be connected in the shortest distance, and, at the same time, the sub-passage 25 and the second main passage 45 can be connected in the shortest distance.

The optical modules 20 adjacent to each other are spaced apart from each other. Since the optical modules 20 adjacent to each other are spaced apart from each other, even when the optical module 20 is deformed by heat or the like, it is possible to suppress application of stress due to the deformation of the optical module 20 to the optical modules 20 adjacent to each other. Furthermore, since the optical modules 20 adjacent to each other are spaced apart from each other, heat transfer between the optical modules 20 adjacent to each other can be suppressed. Thus, when three or more optical modules 20 are arranged in parallel, it can be suppressed that the temperature of the optical module 20 disposed inside becomes higher than the temperature of the optical module 20 disposed outside. That is, it can be suppressed that the temperature of each of the optical modules 20 becomes non-uniform.

The plurality of optical modules 20 are arranged in parallel in the direction parallel to the fast axis of the light emitted from the laser diode 31, and among the outer peripheral surfaces of the respective optical modules 20, the surface not perpendicular to the parallel direction of the plurality of optical modules 20 is fixed to a fixing member (not shown). In the optical module 20 including the plurality of laser diodes 31, the lights emitted from the plurality of laser diodes 31 are superposed on the fast axis and guided to the outside. Further, in the optical module 20, the size in a direction parallel to a direction in which the lights emitted from the plurality of laser diodes 31 are overlaid tends to be smaller than the size in a direction perpendicular to the overlaid direction. Thus, by arranging the plurality of optical modules 20 in parallel in the direction parallel to the fast axis of the light emitted from the laser diode 31, the surface not perpendicular to the parallel direction of the plurality of optical modules 20 among the outer peripheral surfaces of the respective optical modules 20 tends to be smaller than a surface perpendicular to the parallel direction. Thus, when the plurality of optical modules 20 are arranged in parallel in this way, the surface not perpendicular to the parallel direction of the plurality of optical modules among the outer peripheral surfaces of the respective optical modules 20 is fixed to the fixing member, so that an installation area of the optical module unit 10 can be reduced.

Next, one or more embodiments of the present invention will be described in detail with reference to FIG. 12. Note that constituent elements the same as or equivalent to those in the above embodiments are denoted by the same reference numerals, and duplicate description may be omitted unless otherwise described.

Figure 12:
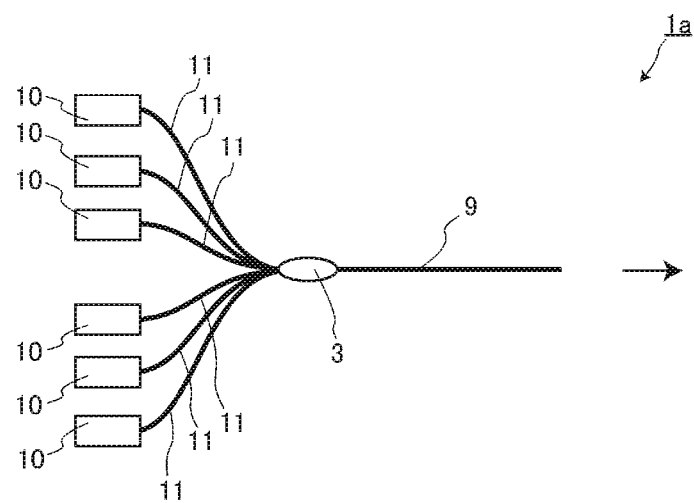
FIG. 12 is a diagram showing a configuration of a laser device according to one or more embodiments of the present invention.

FIG. 12 is a diagram showing a configuration of a laser device 1a according to one or more embodiments of the present invention. As shown in FIG. 12, the laser device 1a of one or more embodiments differs from the laser device 1 of one or more embodiments in that the amplification optical fiber 5 is not included. In the laser device 1a of one or more embodiments, light emitted from a plurality of optical module units 10 enters one end of an optical fiber 9 via an optical fiber 11 and an optical combiner 3, and is emitted from the other end of the optical fiber 9. The optical fiber 9 has the same configuration as the optical fiber 6 of one or more embodiments except that the optical fiber 9 does not include the second FBG 8.

One or more embodiments of the present invention has been described so far. However, the present invention is not limited to these embodiments.

For example, in the foregoing embodiments, the example has been described in which the plurality of laser diodes 31 are arranged on the stepped-shaped element arrangement surface 24s and the sub-passage 25 is formed to be inclined with respect to the element arrangement surface 24s. However, the sub-passage 25 may be formed in parallel to the element arrangement surface 24s.

In the foregoing embodiments, the example has been described in which the mount 24 has the plurality of element arrangement surfaces 24s formed in a stepped shape. However, the mount 24 may be formed in a flat plate shape.

In the foregoing embodiments, the example has been described in which at least some of the plurality of laser diodes 31 are arranged at the position that does not overlap with the central axis of the sub-passage 25 in the direction perpendicular to the installation surface of the laser diode 31. The laser diode 31 may be disposed at a position that overlaps with the central axis of the sub-passage 25 in the direction perpendicular to the installation surface of the laser diode 31.

In the foregoing embodiments, the example has been described in which each of the optical modules 20 is fixed to the manifold 40 in the surface that faces the surface where the optical fiber 29 that guides the light, emitted from the plurality of the laser diodes 31, to the outside is disposed. However, the other surface of each of the optical modules 20 may be fixed to the manifold 40.

In the foregoing embodiments, the example has been described in which the sub-passage 25 included in each of the optical modules 20 is connected to the main passage of the manifold 40 on the surface side where the optical module 20 is fixed to the manifold 40. However, the inlet 25i and the outlet 25o of the sub-passage 25 may be formed on another surface.

In the foregoing embodiments, the example has been described in which the optical modules 20 adjacent to each other are arranged to be spaced apart from each other. However, the optical modules 20 adjacent to each other may be in contact with each other.

In the foregoing embodiments, the example has been described in which the plurality of optical modules 20 are arranged in parallel in the direction parallel to the fast axis of the light emitted by the laser diode 31. However, the direction in which the plurality of optical modules 20 are arranged in parallel is not limited thereto.

As described above, according to one or more embodiments of the present invention, it is possible to provide an optical module unit capable of suppressing variations in cooling efficiency of a plurality of optical modules, and a laser device including the optical module unit. The optical module unit and the laser device are usable in the technical fields of laser processing devices and others, for example.

Although the disclosure has been described with respect to only a limited number of embodiments, those skilled in the art, having benefit of this disclosure, will appreciate that various other embodiments may be devised without departing from the scope of one or more embodiments of the present invention. Accordingly, the scope of the invention should be limited only by the attached claims.

REFERENCE SIGNS LIST

1 . . . laser device
2 . . . pumping light source
5 . . . amplification optical fiber
10 . . . optical module unit
20 . . . optical module
24 . . . mount
24s . . . element arrangement surface
25 sub-passage
31 laser diode (light emitting element)
40 manifold
41 first main passage (main passage)
45 second main passage (main passage)

The invention claimed is:

1. An optical module unit comprising:
optical modules each comprising:
light emitting elements;

a mount comprising:
element arrangement surfaces parallel to each other on which the light emitting elements are disposed on one side of the mount;
a sub-passage that is a groove disposed in a planar surface of the mount that is inclined with respect to the element arrangement surfaces; and
a bottom lid that covers the sub-passage; and
a manifold to which the optical modules are fixed, wherein
the manifold comprises a first main passage to which a first end of the sub-passage of the mount of each optical modules is connected in parallel,
adjacent ones of the optical modules are spaced apart from each other along a first direction,
the optical modules are disposed on a same planar surface of the manifold,
the element arrangement surfaces are offset from each other in the first direction,
the groove and the planar surface of the mount are inclined in the first direction, and
an average of shortest distances between the respective light emitting elements and the inclined sub-passage in the first direction is smaller than that in a case where the sub-passage is parallel to the element arrangement surfaces.

2. The optical module unit according to claim 1, further comprising:
a second main passage to which a second end of each of the sub-passages is connected in parallel.

3. The optical module unit according to claim 2, wherein the manifold comprises the second main passage.

4. The optical module unit according to claim 1, wherein with respect to each of the optical modules:
at least one of the light emitting elements does not overlap with a central axis of the sub-passage in a direction perpendicular to the element arrangement surface on which the respective light emitting element is disposed.

5. The optical module unit according to claim 1, wherein each of the optical modules comprises an optical fiber that guides the light emitted from the light emitting elements to an outside of the mount, wherein one surface of the optical module is fixed to the manifold, and faces another surface of the optical module where the optical fiber is disposed.

6. The optical module unit according to claim 5, wherein the sub-passage of each of the optical modules is connected to the first main passage on a side where the optical module is fixed to the manifold.

7. A laser device comprising:
the optical module unit according to claim 1; and
an optical fiber that propagates light emitted from the optical module unit.

8. The laser device according to claim 7, wherein the optical modules are disposed in a direction parallel to a fast axis of light emitted by the light emitting elements,
an outer peripheral surface of the respective optical modules is fixed to a fixing member, and
the outer peripheral surface is not perpendicular to a direction parallel to the optical modules.

9. The optical module unit according to claim 1, wherein an inclination of the groove and the planar surface of the mount in the first direction corresponds to an inclination of the offset element arrangement surfaces in the first direction.

10. The optical module unit according to claim 9, wherein the shortest distances between the respective light emitting elements and the inclined sub-passage in the first direction is the same.

* * * * *